US008963630B2

(12) United States Patent
Ceballos et al.

(10) Patent No.: US 8,963,630 B2
(45) Date of Patent: Feb. 24, 2015

(54) SYSTEM AND METHOD FOR BOOSTED SWITCHES

(75) Inventors: Jose Luis Ceballos, Villach (AT); Christian Reindl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 13/527,104

(22) Filed: Jun. 19, 2012

(65) Prior Publication Data

US 2013/0335055 A1 Dec. 19, 2013

(51) Int. Cl.
*H02M 3/07* (2006.01)
*H03K 5/00* (2006.01)

(52) U.S. Cl.
USPC .......................................... 327/589; 327/337

(58) Field of Classification Search
USPC .................... 327/534–561, 589, 336–337
See application file for complete search history.

(56) References Cited

U.S. PATENT DOCUMENTS

| 5,729,165 A | 3/1998 | Lou et al. |
| 6,118,326 A | 9/2000 | Singer et al. |
| 8,604,868 B2 * | 12/2013 | Ucciardello et al. ......... 327/536 |

OTHER PUBLICATIONS

Da Silva, J.B., "High-Performance Delta-Sigma Analog-to-Digital Converters," A Thesis, Oregon State University, Jul. 14, 2004, commencement Jun. 2005; 152 pages.
Otsuka, N. et al., "Circuit Techniques for 1.5-V Power Supply Flash Memory," IEEE Journal of Solid-State Circuits, vol. 32, No. 8, Aug. 1997, 14 pages.
Lou, J.H., et al., "A 1.5V Full-Swing Bootstrapped CMOS Large Capacitive-Load Driver Circuit Suitable for Low-Voltage CMOS VLSI," IEEE Journal of Solid-State Circuits, vol. 32, No. 1, Jan. 1997, 3 pages.
"Lecture 140—The MOS Switch and Diode," Lecture 140—The MOS Switch and MOS Diode Lecture Organization, CMOS Analog Circuit Design, P.E. Allen—201, Mar. 25, 2010, 16 pages.
Fayomi, C.J.B. et al., "Low-Voltage CMOS Analog Bootstrapped Switch for Sample-and-Hold Circuit: Design and Chip Characterization," IEEE, 2005, 4 pages.
Enz, C.C., et al., "Circuit Techniques for Reducing the Effects of Op-Amp Imperfections: Autozeroing, Correlated Double Sampling, and Chopper Stabilization," Proceedings of the IEEE, vol. 84, No. 11, Nov. 1996, 31 pages..
Dessouky, M. et al., "Very Low-Voltage Digital-Audio ΔΣ Modulator with 88-dB Dynamic Range Using Local Switch Bootstrapping," IEEE Journal of Solid-State Circuits, vol. 36, No. 3, Mar. 2001, 7 pages.
Ceballos, J.L., "CMOS Pseudo-Analog Switched-Capacitor Delta and Delta-Sigma Modulators," Centro de Tecnicas Analogico-Digitales, 2001, 5 pages.
Aksin, D., et al., "Switch Bootstrapping for Precise Sampling Beyond Supply Voltage," IEEE Journal of Solid State Circuits, vol. 41, Issue 8, Aug. 2006, pp. 1938-1943

* cited by examiner

*Primary Examiner* — Dinh Le
(74) *Attorney, Agent, or Firm* — Slater & Matsil, L.L.P.

(57) ABSTRACT

In accordance with an embodiment, a method includes activating a first semiconductor switch having a first switch node coupled to a first input of a bootstrap circuit, a second switch node, and a control node coupled to a first end of a capacitor of the bootstrap circuit. A first end of the capacitor is coupled to the first input of the bootstrap circuit and a second end of the capacitor is set to a first voltage. Next, the first end of the capacitor is decoupled from the first input of the bootstrap circuit, and the second end of the capacitor is set to a second voltage. The control node is boosted to a first activation voltage that turns on the first semiconductor switch.

26 Claims, 7 Drawing Sheets

SYSTEM AND METHOD FOR BOOSTED SWITCHES

TECHNICAL FIELD

This invention relates generally to semiconductor circuits and methods, and more particularly to a system and method for boosted switches.

BACKGROUND

Switched capacitor circuits are used in a variety of applications ranging from audio A/D converters to analog filter circuits. At its most basic level, switched capacitor circuits perform analog signal processing in the charge domain by sampling charge on capacitors. By using a combination of feedback amplifiers, switching devices and ratioed capacitors, various sampled analog transfer functions may be accurately represented even in the presence of a high amount of component value variation.

As the geometry of semiconductor processes has been shrinking, and as the demand for low power devices has been increasing, there has been a corresponding decrease in supply voltages for the purpose of preventing device breakdown and damage in smaller geometry devices and to reduce power consumption. In order to maintain headroom in switched capacitor circuits, various supply and clock boosting techniques have been employed to operate switching transistors. For example, given a 1.2 V supply voltage and a 0.7 V transistor threshold, an NMOS switching transistor would only have a compliance range of about 0.5 V if the full supply voltage of 1.2V were used to turn-on the transistor. If, on the other hand, a boosted supply or boosted gate signal is used, for example, to produce a 2V gate drive, the switching transistor may operate over a compliance range encompasses the entire 1.2 V power supply range.

Even with lower power supply voltages, however, there is still a need for switched capacitor circuits that are operable in the presence of input signals having voltages that may exceed the provided supply voltage, for example, in industrial and in automotive applications.

SUMMARY OF THE INVENTION

In accordance with an embodiment, a method includes activating a first semiconductor switch having a first switch node coupled to a first input of a bootstrap circuit, a second switch node, and a control node coupled to a first end of a capacitor of the bootstrap circuit. A first end of the capacitor is coupled to the first input of the bootstrap circuit and a second end of the capacitor is set to a first voltage. Next, the first end of the capacitor is decoupled from the first input of the bootstrap circuit, and the second end of the capacitor is set to a second voltage. The control node is boosted to a first activation voltage that turns on the first semiconductor switch.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a differential switched capacitor amplifier configured to operate over a wide range of common mode input voltages, such as those found in noisy industrial or automotive environments. The invention may also be applied, however, to other types of switched capacitor circuits and systems that utilize boosted switches.

In an embodiment, a switched capacitor circuit, such as an amplifier or an integrator, operates in two voltage domains: a high voltage domain at the input of the switched capacitor circuit, and a low voltage domain internal to amplifiers of the switched capacitor circuit. In the high voltage domain at the input to the circuit, a bootstrapped clock phase generator is used to ensure that input switches remain compliant over a large common-mode voltage range. In embodiments that utilize a differential input, a single bootstrapped clock phase generator having a bootstrap bias node coupled to a common mode input voltage derived, for example, via a voltage divider, may be used for each differential input if the peak differential voltage is low, for example, up to 20 mV. Alternatively, a bootstrapped clock phase generator may be allocated to each differential input, where each bootstrapped clock phase generator has a bootstrap bias node that is coupled to its respective differential input terminal of the switched capacitor circuit.

Figure 1:
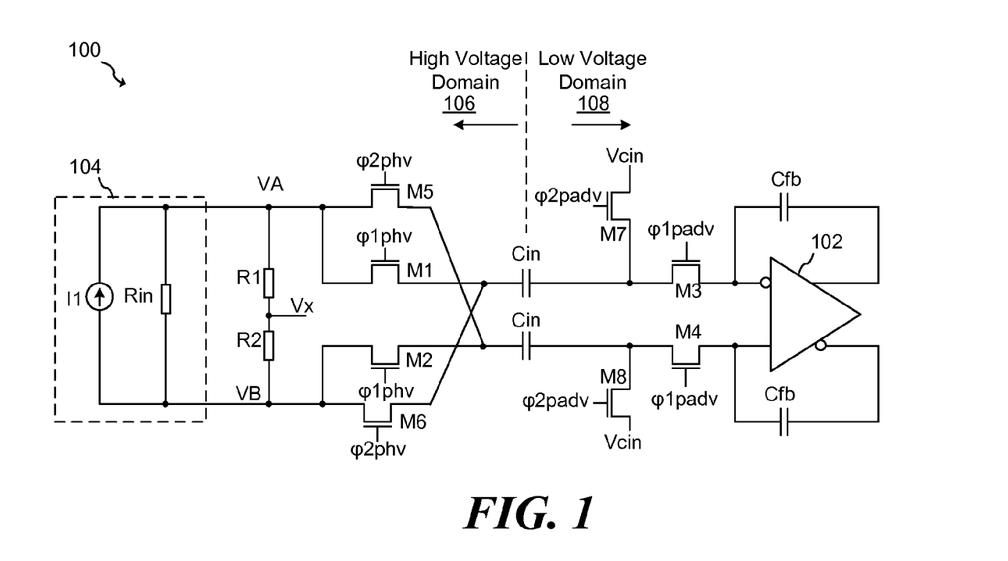
FIG. 1 illustrates a switched capacitor circuit according to an embodiment of the present invention.

FIG. 1 illustrates switched capacitor circuit 100 in accordance with an embodiment of the present invention. In an embodiment, switched capacitor circuit 100 implements an integrator. However, in alternative embodiments, other switched capacitor circuits may be implemented such as, but not limited to amplifiers and filters. Circuit 100 includes differential amplifier 102 with feedback capacitors Cfb coupled between its input and output ports. Series input capacitors Cin are coupled to signal source 104 via switching transistors M1, M2, M5 and M6, and to the input of amplifier 102 via switching transistors M3 and M4. Transistors M7 and M8 are configured to couple common mode bias voltage Vcin to Cin. Signal source 104, which is modeled as a Norton equivalent source including current source I1 and input impedance Rin, is shown in dashed lines to indicate that the source is not necessarily a part of switched capacitor circuit 100. It should be understood that source 104 is a generic model for any type of source such as a last stage of a driving amplifier, the output of a transmission line, etc. In an embodiment, the differential input voltage of switched capacitor amplifier 100 can be expressed as Vd=VA−VB, and the common mode input voltage can be expressed as (VA+VB)/2. In an embodiment, the common mode voltage may be approximated by voltage Vx coupled to resistors R1 and R2. In an embodiment, resistors R1 and R2 have a resistance of about 10 KΩ, and Rin has an impedance in the milliohm region. In alternative embodiments, R1, R2 and Rin may comprise different resistance values.

In an embodiment, switching transistors M1 and M2 are activated by boosted clock signal φ1phv, and switching transistors M5 and M6 are activated by boosted clock signal φ2phv. Transistors M3 and M4, on the other hand may be activated by clock signals φ1adv, and transistors M7 and M8 are activated by clock signal φ2adv. Clock signals φ1adv and φ2adv may be non-boosted clock signals. Therefore, transistors M1, M2, M5 and M6 may operate in a high voltage clock domain and transistors M3, M4, M7 and M8 may operate in a low voltage clock domain. Accordingly, transistors M1, M2, M5 and M6 may be implemented using high voltage device and transistors M3, M4, M7 and M8 may be implemented using low voltage device. Alternatively, clock signals φ1adv and φ2adv may be boosted clock signals in embodiments where the switch is expected to operate over a range of voltages. While transistors M1, M2, M3, M4, M5, M6, M7 and M8 are illustrated as being NMOS devices, other devices, such as PMOS devices may be used in alternative embodiments.

In some embodiments, φ1phv and φ2phv may non-overlapping clock signals and φ1adv and φ2adv may be non-overlapping clock signals that transition before φ1phv and φ2phv. Having φ1adv and φ2adv transition before φ1phv and φ2phv helps prevent charge injection errors when switching transistors M1 and M2 are turned off.

It should be understood that switched capacitor circuit 100 is just one example of many possible switched capacitor circuit topologies. For example, embodiments of the present invention may be applied to other switched capacitor topologies such as various types of active switched capacitor filters, Sigma Delta analog to digital converters, analog front ends, and other circuits.

In an embodiment, the common mode voltage range of front-end portion 106 shown to the left of series input capacitors Cin may experience a wider voltage variation than back end portion 108 shown to the left of series input capacitors Cin. Such a case, for example, may occur in noisy industrial environments or within an automotive environment. In one embodiment of the present invention voltages VA and VB may experience small peak differential input voltages in the order of 10 mV to 20 mV. The common mode voltage, however, may experience a peak voltage of 10 V or greater. These common mode peaks may also be manifested as voltage spikes and transients. In alternative embodiments, the front end of circuit 100 may be adapted to accept differential and common mode voltage ranges different from those stated above.

Figure 2A:
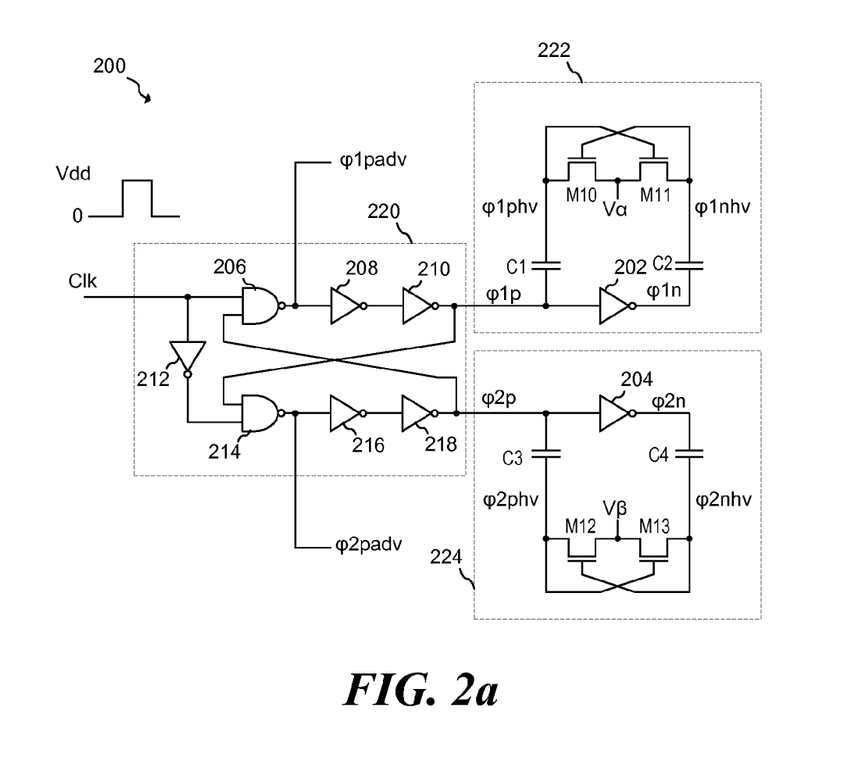
FIGS. 2a-c illustrate an embodiment boosted clock phase generator and associated waveforms.

FIG. 2a illustrates embodiment clock phase generator 200 that may be used to generate the clock signals for switched capacitor circuit 100 shown in FIG. 1. Clock phase generator 200 includes nonoverlapping clock generator 220, clock booster circuit 222, and clock booster circuit 224. Nonoverlapping clock generator 220 includes NAND Gates 206 and 214 and inverters 208, 210, 212, 216, and 218, which form a latch structure that produces nonoverlapping signals φ1 and φ2 according to input clock signal Clk.

Figure 2B:
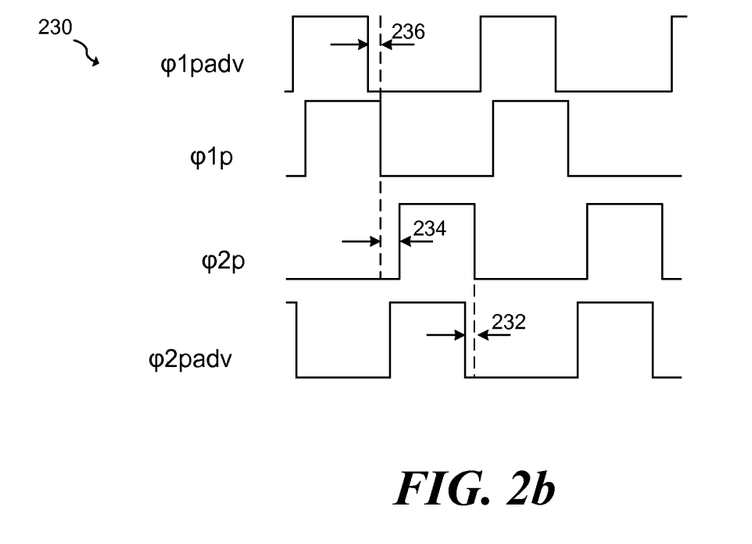

FIG. 2b illustrates waveform diagram 230 that shows the relationship between signals φ1padv, φ1, φ2p and φ2padv. As illustrated in the waveform diagram, there is a non-overlapping dead zone region 234 between the time that signal φ1 is de-asserted and signal φ2 is asserted. Furthermore, signal φ1p lags φ1adv by time period 236, and signal φ2p lags φ2adv by time period 232. In an embodiment, time period 234 corresponds to the delay associated with inverters 208 and 210, and time period 232 corresponds to the delay associated with inverters 216 and 218 illustrated in FIG. 2a.

In an embodiment, clock booster circuit 222 includes boosting capacitors C1 and C2, cross-coupled NMOS transistors M10 and M11, as well as inverter 202. Similarly, clock booster circuit 224 includes boosting capacitors C3 and C4, cross-coupled NMOS transistors M12 and M12, and inverter 204. It should be understood that while clock booster circuits 222 and 224 are illustrated with cross-coupled NMOS devices, in alternative embodiments of the present invention other device types may be used for these cross-coupled devices, such as PMOS devices. Nonoverlapping clock generator 220 may also be implemented using other nonoverlapping clock generation structures known in the art.

Turning back to FIG. 2a, in an embodiment, clock booster 222 operates as follows during active operation. In a first phase of operation, signal φ1p is low and signal φ1n is high. Accordingly, signal φ1phv is assumes a lower voltage than signal φ1nhv, such transistor M10 is driven into an ON state, thereby coupling bootstrap bias node Vα to signal φ1phv, and transistor M11 assumes an OFF state. During this first phase of operation, capacitor C1 is charged to a voltage of Vα. In a second phase of operation, signal φ1p transitions from low to high and signal φ1n transitions from high to low. Accordingly, node φ1phv is boosted to VDD+Vα via capacitor C1, which causes transistor M11 to be driven in to the ON state, and node φ1nhv is driven to Vα via M11, and which causes transistor M10 to shut off. VDD, in this case, corresponds to the logic swing of inverter 210.

Figure 2C:
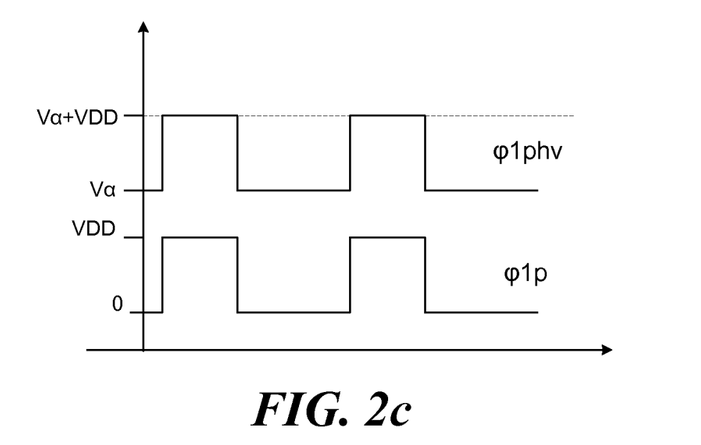

During a third phase of operation, signal φ1p transitions from high to low and signal φ1n transitions from low to high. In this phase, signal φ1nhv is boosted to VDD+Vα, and signal φ1phv assumes a voltage of Vα. Operation of clock booster 222 alternates between phases two and three during normal operation. Clock booster 224 operates in a manner similar to clock booster 222, wherein phases φ1phv and φ1nhv alternate between Vβ and VDD+Vβ. FIG. 2c illustrates a waveform diagram that illustrates the relationship between signal φ1p and signal φ1phv.

In an embodiment of the present invention, node Vα is coupled to node VA, and node Vβ is coupled to node VB of switched capacitor circuit 100. Such connectivity may be implemented, for example, in cases in which the peak differential input voltage of switch capacitor amplifier 100 exceeds a few tens of mV. In embodiments where the peak differential input voltage to switch capacitor circuit 100 is less then, for example, 20 mV, nodes Vα and Vβ may both be coupled to common mode voltage Vx. Because the peak differential input voltage is small in this case, common mode voltage of Vx may vary, while the gate source voltage of switching transistors M1 and M2 remained relatively constant.

Figure 3A:
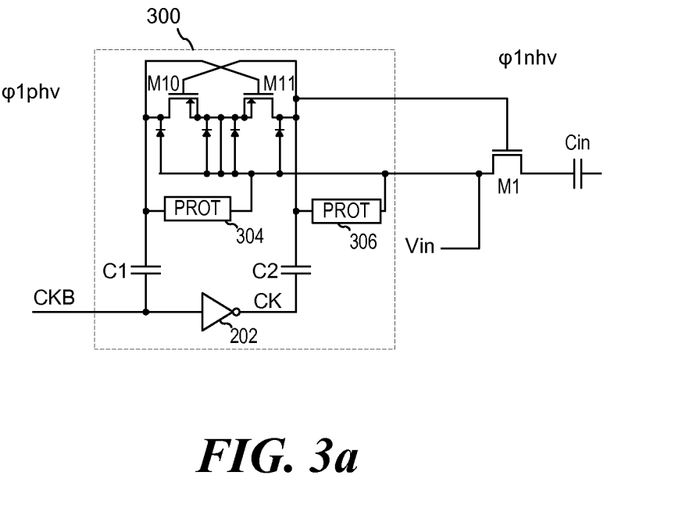
FIGS. 3a-b illustrate an embodiment clock booster circuit with protection devices.
Figure 3B:
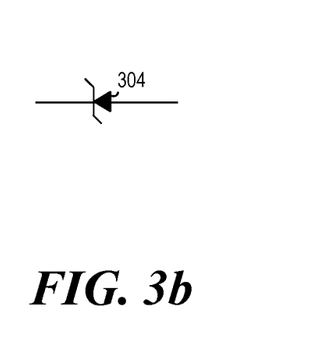

FIG. 3a illustrates embodiment clock booster circuit 300 coupled to switching transistor M1. The structure of clock boosting circuit 300 is similar to the structure of clock boosting circuits 222 and 224 shown in FIG. 2a with the addition of protection devices 304 and 306. These protection devices as well as other protection structures protect transistor M1 from experiencing a catastrophic gate over-voltage. In an embodiment, these protection devices may be implemented using Zener diodes, as shown in FIG. 3b. Alternatively, other diode types or other types of clamping circuits may be used in alternative embodiments of the present invention.

In an embodiment, if voltage Vin experiences a fast positive transient, parasitic bulk diodes 302 of transistors M10 and M11 as well as protection devices 304 and 306 clamp the source-gate voltage of M1 to one diode drop. In the case of a negative going transient in an embodiment that uses Zener diodes for clamps, device 304 and 306 clamp the gate-source voltage of M1 to the Zener voltage of the diode within protection circuit 306 if the diode is implemented using a Zener diode. In one embodiment, these Zener diodes may have a Zener voltage of about 2V. Alternatively, other Zener voltages may be used. In further alternative embodiments, other clamping structures besides Zener diodes may be used, such as series connected MOSFETs.

Figure 4A:
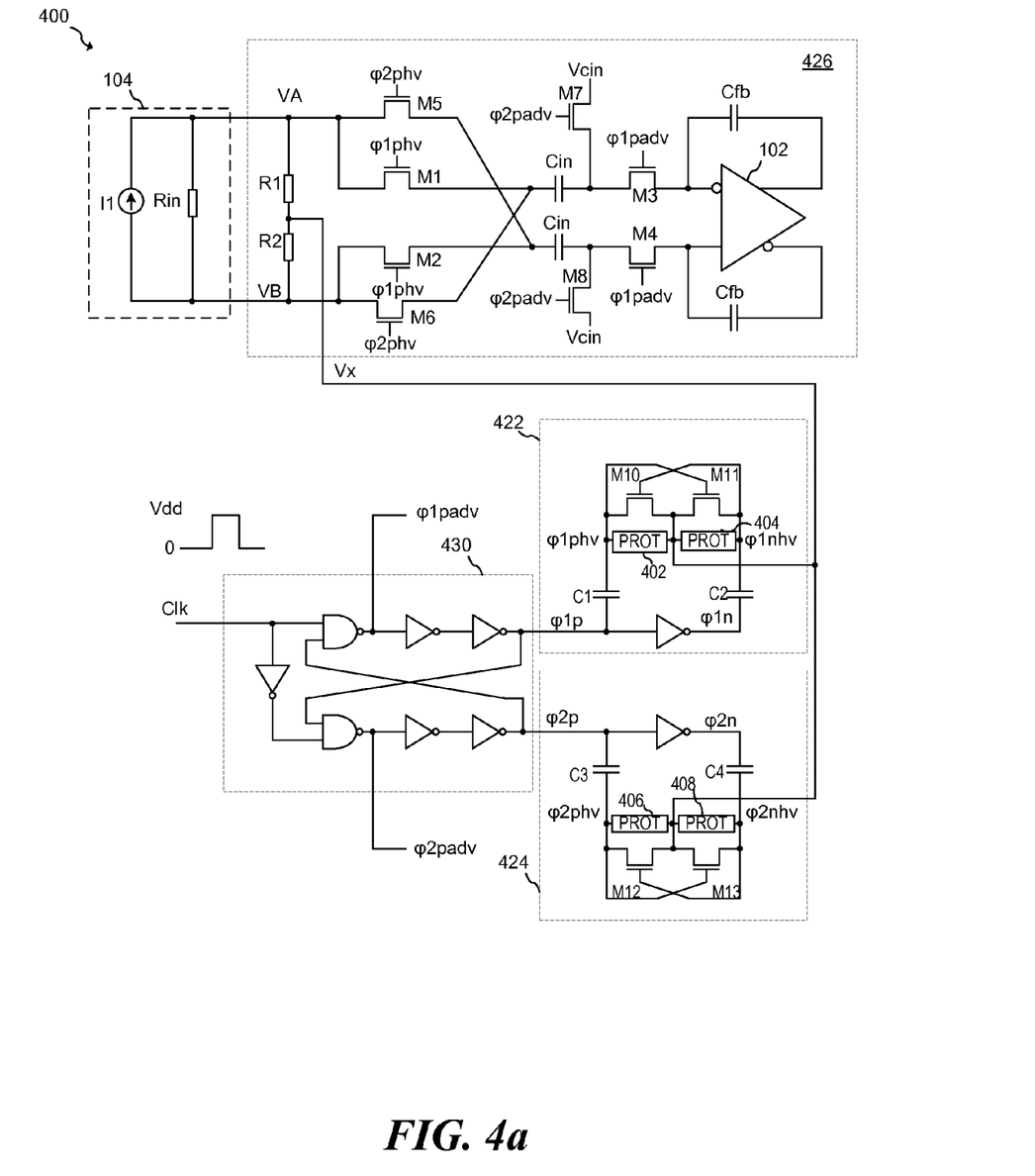
FIGS. 4a-d illustrate embodiment switched capacitor circuits coupled to embodiment clock generation circuits and an associated timing diagram.

FIG. 4a illustrates embodiment switch capacitor circuit 400 that includes clock booster circuits 422 and 424 coupled to switched capacitor amplifier 426 and to non-overlapping clock generator 430. Here, common mode voltage Vx is coupled to cross-coupled transistors M10 and M11 in clock booster circuit 422, as well as to cross-coupled transistors M12 and M13 in clock booster circuit 424. As noted above, by using common mode voltage Vx, transistors M1 and M2 are able to maintain a sufficient gate source voltage during operation if peak differential voltage Vd is less than about 20 mV. In some embodiments, the conductivity illustrated in FIG. 4a may be suitable for some circuits in which the peak differential voltage exceeds 20 mV. The extent to switch the peak differential voltage may be increased beyond about 20 mV depends on the particular implementation and its specifications. By using common mode voltage Vx, some device area savings may be achieved due to the reduced number of circuits involves in generating boosted clock signals.

As illustrated in FIG. 4a, clock booster circuits 422 and 424 further include protection devices 402, 404, 406, and 408, which serve to prevent gate source voltage of M1 and M2 from exceeding device limits. As discussed hereinabove with respect to FIGS. 3a-b, these protection devices may be implemented using Zener diodes.

Figure 4B:
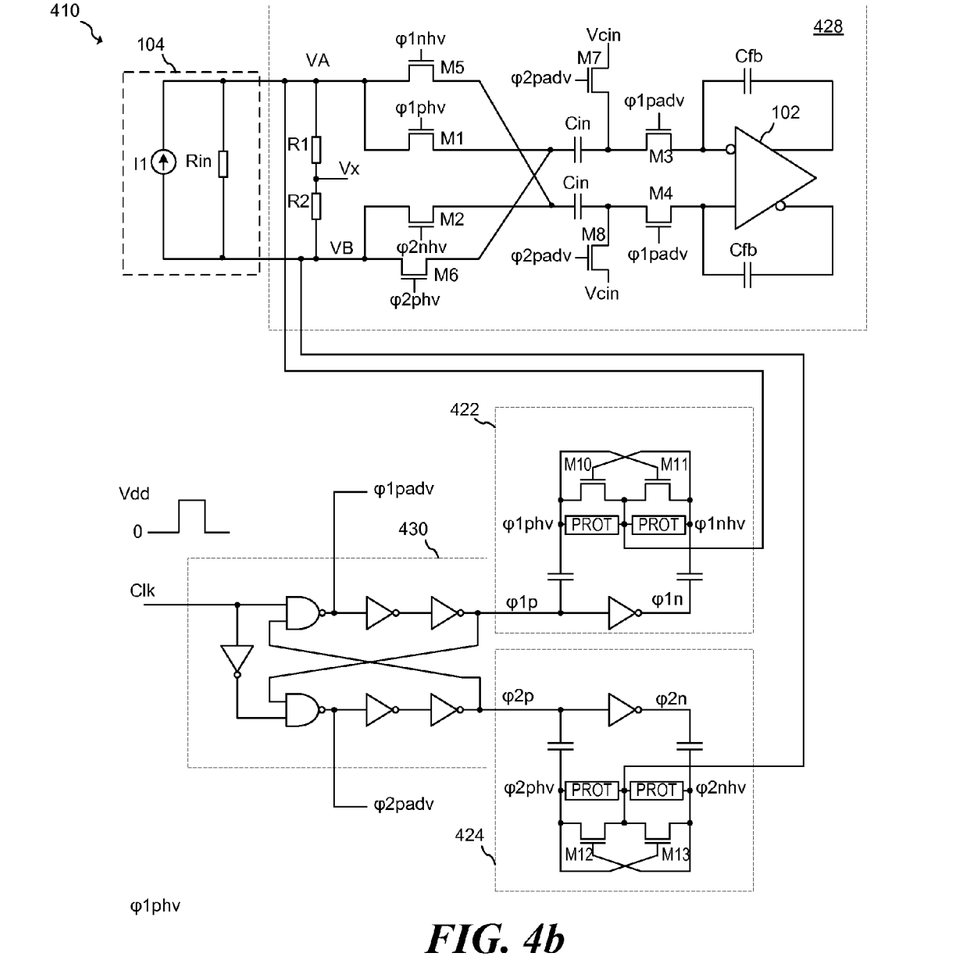
Figure 4C:
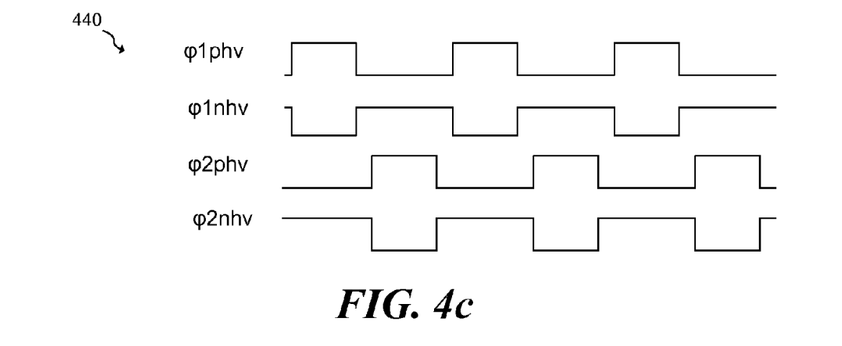

FIG. 4b illustrates embodiment switched capacitor amplifier 410 according to a further embodiment having clock booster circuits 422 and 424 coupled to switched capacitor amplifier 428. Here, voltage VA is coupled to cross-coupled transistors M10 and M11 in clock booster circuit 422, and voltage VB is coupled to cross-coupled transistors M12 and M13 in clock booster 424. As mentioned above, such connectivity may be suitable for embodiments with higher peak differential input voltages. In the switched capacitor amplifier 410, transistor M1 is coupled to $\phi1phv$ and transistor M6 is coupled to $\phi2phv$ similar to switched capacitor amplifier 400 illustrated the embodiment of FIG. 4a. In switched capacitor amplifier 410, however, transistor M5 is coupled to $\phi1nhv$ instead of $\phi2phv$, because transistor M5 is coupled to VA and because switch driver 422 than generates $\phi1nhv$ is biased by VA, thereby ensuring that M5 turns on in the presence of a large differential voltage. Similarly, transistor M2 is coupled to $\phi2nhv$ instead of $\phi1phv$, because transistor M2 is coupled to VB and because switch driver 424 than generates $\phi2nhv$ is biased by VB. Even though some of these signals may overlap, accuracy of the switched capacitor integrator is maintained if Rin has a low impedance, for example in the mΩ region, such that the on-resistance of M1, M2, M5 and M6 are non-dominant. FIG. 4c illustrates a timing diagram of clock phases $\phi1phv$, $\phi1nhv$, $\phi2phv$ and $\phi2nhv$.

Figure 4D:
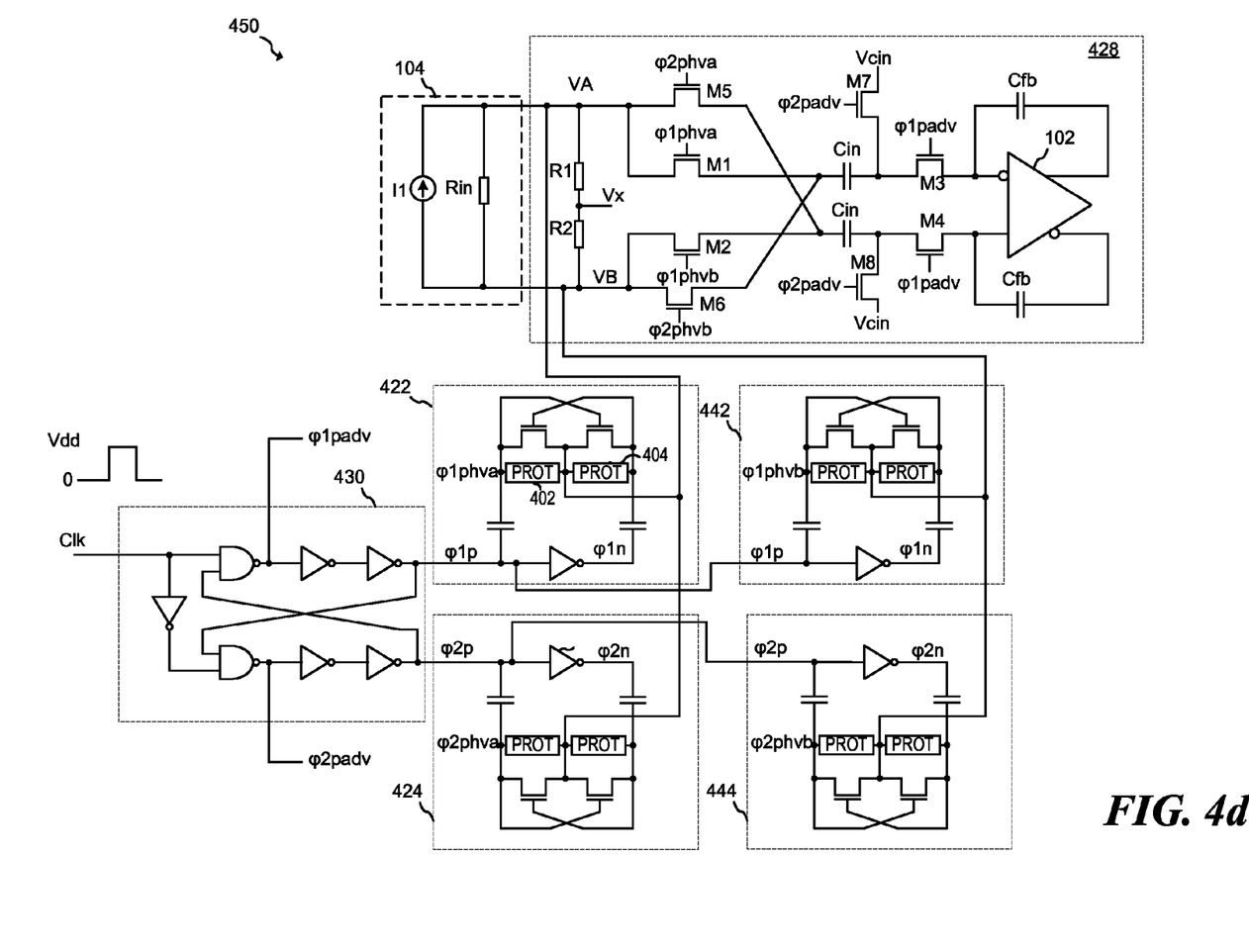

FIG. 4d illustrates embodiment switched capacitor amplifier 450 according to a further embodiment having clock booster circuits 422, 424, 442 and 444 coupled to switched capacitor amplifier 428. Here, voltage VA is used to bias clock booster circuits 422 and 424, and voltage VB is used to bias clock booster circuits 442 and 444. In an embodiment, transistor M1 is driven by $\phi1phva$, which is generated by clock booster circuit 422, transistor M2 is driven by $\phi1phvb$, which is generated by clock booster circuit 442, transistor M5 is driven by $\phi2phva$, which is generated by clock booster circuit 424, and transistor M6 is driven by $\phi2phvb$, which is generated by clock booster circuit 444. Here, clock phases $\phi1phva$ and $\phi1phvb$ are non-overlapping with respect to clock phases $\phi2phva$ and $\phi2phvb$. As such, switched capacitor amplifier 450 is suitable for operation in circuits operating under a higher peak differential voltage inputs as well as having a higher input impedance Rin.

Figure 5:
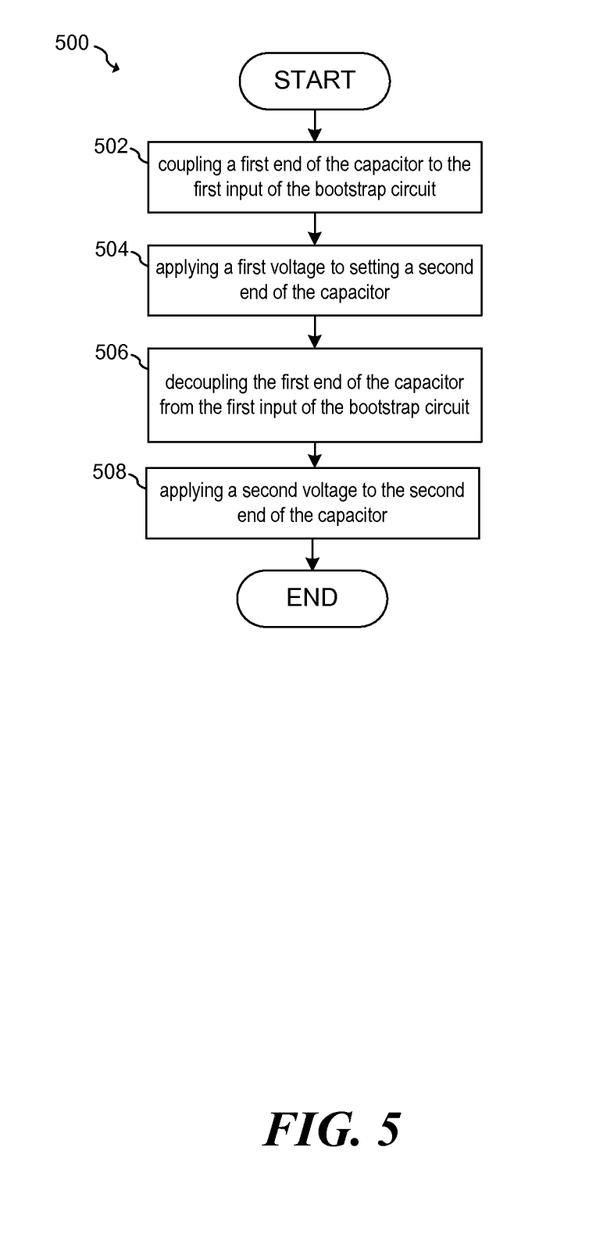
FIG. 5 illustrates an embodiment method.

FIG. 5 illustrates a method 500 of activating a first semiconductor switch having a first switch node coupled to a first input of a bootstrap circuit, a second switch node, and a control node coupled to a first end of a capacitor of the bootstrap circuit. In step 502, a first end of the capacitor is coupled to the first input of the bootstrap circuit. Next, in step 504, a first voltage is applied to a second end of the capacitor. After coupling the first end of the capacitor and applying the first voltage to the second end of the capacitor, the capacitor is decoupled from the first input of the bootstrap circuit in step 506. Next, a second voltage is applied to the second end of the capacitor in step 508. Accordingly, the control node of the first semiconductor switch is boosted to a first activation voltage that turns on the first semiconductor switch.

In accordance with an embodiment, a method includes activating a first semiconductor switch having a first switch node coupled to a first input of a bootstrap circuit, a second switch node, and a control node coupled to a first end of a capacitor of the bootstrap circuit. Activating includes coupling a first end of the capacitor to the first input of the bootstrap circuit and setting a second end of the capacitor to a first voltage. After coupling the first end of the capacitor and setting the second end of the capacitor to the first voltage, the first end of the capacitor is decoupled from the first input of the bootstrap circuit, and after decoupling the first end of the capacitor, the second end of the capacitor is set to a second voltage, wherein the control node is boosted to a first activation voltage that turns on the first semiconductor switch. The method may further include deactivating the first semiconductor switch by coupling the first end of the capacitor to the first input of the bootstrap circuit and setting the second end of the capacitor to the first voltage.

In an embodiment, the method further includes charging a series capacitor having a first end coupled to the second switch node. Charging the series capacitor may include the steps of activating the first semiconductor switch, and activating a second semiconductor switch having a third switch node coupled to a second end of the series capacitor. In some embodiments, the first semiconductor switch is activated a first time delay after the second semiconductor switch is activated.

In an embodiment, charging the series capacitor further includes coupling a virtual ground to a fourth switch node of the second semiconductor switch. Coupling the virtual ground may include coupling a feedback amplifier to the fourth switch node of the semiconductor switch. In an embodiment, activating the second semiconductor switch includes coupling a control node of the semiconductor switch to a second activation voltage, such that the second activation voltage is less than the first activation voltage.

In an embodiment, the method further includes comprising protecting the first semiconductor switch by limiting a voltage difference between the first switch node of the first semiconductor switch and the control node of the semiconductor switch using a Zener diode coupled between the first switch node of the first semiconductor switch and the control node of the semiconductor switch.

In accordance with a further embodiment, a circuit includes a first semiconductor switch coupled between a first node and a second node, and a bootstrap circuit configured to provide a boosted activation signal at a first output of the bootstrap circuit to a control node of the semiconductor switch when a clock input of bootstrap circuit transitions from a first state to a second state. The bootstrap circuit includes a first input coupled to the first node of the semiconductor switch, a first output coupled to a control node of the first semiconductor switch, a first capacitor comprising a first end coupled to the first output and a second end coupled to a clock input, and a second semiconductor switch coupled between the first input and the first output. In an embodiment, the bootstrap circuit is configured to provide a boosted activation signal at the first output of the bootstrap circuit when the clock input transitions from a first state to a second state. The bootstrap circuit may further include a second capacitor and a third semiconductor switch. The second capacitor has a first end coupled and a second end that may be coupled to an inverted clock input and to a control node of the second semiconductor switch. The inverted clock input has an opposite logic sense from the clock input. The third semiconductor switch is coupled between the first input and the first end of a second capacitor, and includes a control input coupled to the first end of the first capacitor.

In an embodiment, the first and second semiconductor switches are implemented using MOS transistors. These MOS transistors may be NMOS or PMOS transistors.

In an embodiment, the circuit also includes a first series capacitor coupled between the second node of the first semiconductor switch and a first input of an amplifier. In some embodiments, the amplifier is implemented as a differential amplifier; and the first node of the first semiconductor switch is coupled to the first input of the first network via a plurality of resistors coupled between the first input and a second input of the amplifier. The first input of the amplifier may be configured as a virtual ground.

In accordance with a further embodiment, a switched capacitor circuit includes a differential amplifier comprising a first input terminal and a second input terminal, a first system capacitor having a second end coupled to the first input terminal, a second system capacitor having a second end coupled to the second input terminal, a first switching transistor including a first node coupled to a first system input and a second node coupled to a first end of the first capacitor, a second switching transistor comprising a first node coupled to a second system input and a second node coupled to a first end of the second system capacitor, and a first bootstrap circuit. The first bootstrap circuit includes a first output coupled to a control terminal of the first switching transistor, a first input coupled to the first system input, a first bootstrap capacitor including a first end coupled to the first output and a second end coupled to a first clock signal, and a first bootstrap transistor coupled between the first input and the first output. The first bootstrap circuit is configured to provide a boosted activation signal at a first output of the first bootstrap circuit when the first clock signal transitions from a first state to a second state. In an embodiment, the input of the first bootstrap circuit is directly connected to the first system input.

In an embodiment, the first bootstrap circuit further includes a second bootstrap transistor coupled between the first input and a first node of a second bootstrap capacitor. The first node of the second bootstrap capacitor is coupled to a control node of the first bootstrap transistor, the first node of the first bootstrap transistor is coupled to a control node of second bootstrap transistor, and a second node of the second bootstrap capacitor is coupled to an opposite phase of the first clock signal.

In an embodiment, the first bootstrap circuit further also includes a first protection device coupled between the first input of the first bootstrap circuit and the first end of the first capacitor of the first bootstrap circuit, and a second protection device coupled between the first input of the first bootstrap circuit and the first end of the second capacitor of the first bootstrap circuit. In some embodiments, the first and second protection devices are Zener diodes.

In an embodiment, the switched capacitor circuit also includes a second bootstrap circuit. This second bootstrap circuit may include a first output coupled to a control terminal of the second switching transistor, a first input coupled to the second system input, and a first bootstrap capacitor comprising a first end coupled to the first output and a second end coupled to a second clock signal. The switched capacitor circuit may also include a non-overlapping clock generator configured to produce the first clock signal and the second clock signal, such that the first clock signal does not overlap the second clock signal.

In an embodiment, the switched capacitor circuit includes a voltage divider coupled between the first system input and the second system input. An output of the voltage divider is connected to the first input of the first bootstrap circuit and the second input of the second bootstrap circuit. In some embodiments, the voltage divider output is configured to produce a common mode input voltage of the switched capacitor circuit.

In an embodiment, the switched capacitor circuit further includes a third switching transistor coupled between the first system capacitor and the first input terminal of the differential amplifier, and a fourth switching transistor coupled between the second system capacitor and the second input terminal of the differential amplifier. The first and second switching transistors are configured to operate at a higher voltage than the third and fourth switching transistors. The switched capacitor circuit may be configured as an integrator.

An advantage of embodiment systems and methods include the ability to operate a switched capacitor amplifier having a high common-mode input range. A further advantage includes the ability to operate a switched capacitor circuit in the presence of large common-mode transients. A further advantage of embodiment systems includes the ability to implement a switched capacitor circuit capable of accepting a high common mode input range in a small area.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method comprising:
activating a first semiconductor switch having a first switch node coupled to a first input of a bootstrap circuit, a second switch node, and a control node coupled to a first end of a capacitor of the bootstrap circuit, activating comprising:
coupling the first end of the capacitor to the first input of the bootstrap circuit,
applying a first voltage to a second end of the capacitor,
after coupling the first end of the capacitor and applying the first voltage to the second end of the capacitor, decoupling the first end of the capacitor from the first input of the bootstrap circuit,
after decoupling the first end of the capacitor, applying a second voltage to the second end of the capacitor, wherein the control node is boosted to a first activation voltage that turns on the first semiconductor switch.

2. The method of claim 1, further comprising deactivating the first semiconductor switch, deactivating comprising coupling the first end of the capacitor to the first input of the bootstrap circuit and applying the first voltage to the second end of the capacitor.

3. The method of claim 1, further comprising charging a series capacitor having a first end coupled to the second switch node, charging the series capacitor comprising:
activating the first semiconductor switch; and
activating a second semiconductor switch having a third switch node coupled to a second end of the series capacitor.

4. The method of claim 3, wherein the first semiconductor switch is activated a first time delay after the second semiconductor switch is activated.

5. The method of claim 3, wherein charging the series capacitor further comprises coupling an input node of a feedback amplifier to a fourth switch node of the second semiconductor switch.

6. The method of claim 3, wherein activating the second semiconductor switch comprises coupling a control node of the semiconductor switch to a second activation voltage, wherein the second activation voltage is less than the first activation voltage.

7. The method of claim 1, further comprising protecting the first semiconductor switch, protecting comprising limiting a voltage difference between the first switch node of the first semiconductor switch and the control node of the semiconductor switch using a zener diode coupled between the first switch node of the first semiconductor switch and the control node of the semiconductor switch.

8. The method of claim 3, wherein the series capacitor is coupled between the second switch node and a first input of an amplifier.

9. A circuit comprising:
a first semiconductor switch coupled between a first node and a second node; and
a bootstrap circuit configured to provide a boosted activation signal at a first output of the bootstrap circuit to a control node of the semiconductor switch when a clock input of bootstrap circuit transitions from a first state to a second state, the bootstrap circuit comprising:
a first input coupled to the first node of the semiconductor switch,
a first output coupled to a control node of the first semiconductor switch,
a first capacitor comprising a first end coupled to the first output and a second end coupled to a clock input, and
a second semiconductor switch coupled between the first input and the first output, the bootstrap circuit configured to provide a boosted activation signal at the first output of the bootstrap circuit when the clock input transitions from a first state to a second state.

10. The circuit of claim 9, wherein the bootstrap circuit further comprises:
a second capacitor comprising a first end coupled and a second end, the second end coupled to an inverted clock input and to a control node of the second semiconductor switch, the inverted clock input having an opposite logic polarity from the clock input; and
a third semiconductor switch coupled between the first input and the first end of a second capacitor, the third semiconductor switch further comprising a control input coupled to the first end of the first capacitor.

11. The circuit of claim 9, wherein the first and second semiconductor switches comprises MOS transistors.

12. The circuit of claim 11, wherein the MOS transistors comprise NMOS transistors.

13. The circuit of claim 9, further comprising a first series capacitor coupled between the second node of the first semiconductor switch and a first input of an amplifier.

14. The circuit of claim 13, wherein the first input of the amplifier is configured as a virtual ground.

15. The circuit of claim 13, wherein:
the amplifier comprises a differential amplifier; and
wherein the first node of the first semiconductor switch is coupled to the first input of the bootstrap circuit via a plurality of resistors coupled between the first input and a second input of the amplifier.

16. A switched capacitor circuit comprising:
a differential amplifier comprising a first input terminal and a second input terminal;
a first system capacitor having a second end coupled to the first input terminal;
a second system capacitor having a second end coupled to the second input terminal;
a first switching transistor comprising a first node coupled to a first system input and a second node coupled to a first end of the first capacitor;
a second switching transistor comprising a first node coupled to a second system input and a second node coupled to a first end of the second system capacitor; and
a first bootstrap circuit comprising:
a first output coupled to a control terminal of the first switching transistor,
a first input coupled to the first system input,
a first bootstrap capacitor comprising a first end coupled to the first output and a second end coupled to a first clock signal, and
a first bootstrap transistor coupled between the first input and the first output, the first bootstrap circuit configured to provide a boosted activation signal at a first output of the first bootstrap circuit when the first clock signal transitions from a first state to a second state.

17. The switched capacitor circuit of claim 16, wherein the first bootstrap circuit further comprises:
a second bootstrap transistor coupled between the first input and a first node of a second bootstrap capacitor, wherein:
the first node of the second bootstrap capacitor is coupled to a control node of the first bootstrap transistor,
the first node of the first bootstrap transistor is coupled to a control node of second bootstrap transistor, and
a second node of the second bootstrap capacitor is coupled to an opposite phase of the first clock signal.

18. The switched capacitor circuit of claim 17, wherein the first bootstrap circuit further comprises:

a first protection device coupled between the first input of the first bootstrap circuit and the first end of the first capacitor of the first bootstrap circuit; and a second protection device coupled between the first input of the first bootstrap circuit and the first end of the second capacitor of the first bootstrap circuit.

19. The switched capacitor circuit of claim 18, wherein the first and second protection devices comprise zener diodes.

20. The switched capacitor circuit of claim 16, further comprising:

a second bootstrap circuit comprising
a first output coupled to a control terminal of the second switching transistor,
a first input coupled to the second system input, and
a first bootstrap capacitor comprising a first end coupled to the first output and a second end coupled to a second clock signal.

21. The switched capacitor circuit of claim 20, further comprising a non-overlapping clock generator configured to produce the first clock signal and the second clock signal, wherein the first clock signal does not overlap the second clock signal.

22. The switched capacitor circuit of claim 20, further comprising:

a voltage divider coupled between the first system input and the second system input, an output of the voltage divider is connected to the first input of the first bootstrap circuit and the second input of the second bootstrap circuit.

23. The switched capacitor circuit of claim 22, wherein the voltage divider output is configured to produce a common mode input voltage of the switched capacitor circuit.

24. The switched capacitor circuit of claim 16, wherein the input of the first bootstrap circuit is directly connected to the first system input.

25. The switched capacitor circuit of claim 16, further comprising:

a third switching transistor coupled between the first system capacitor and the first input terminal of the differential amplifier; and
a fourth switching transistor coupled between the second system capacitor and the second input terminal of the differential amplifier, wherein:
the first and second switching transistors are configured to operate at a higher voltage than the third and fourth switching transistors.

26. The switched capacitor circuit of claim 16, wherein the switched capacitor circuit is configured as an integrator.

* * * * *